United States Patent [19]

Deiss

[11] Patent Number: 4,638,181

[45] Date of Patent: Jan. 20, 1987

[54] SIGNAL SOURCE SELECTOR

[75] Inventor: Michael S. Deiss, Indianapolis, Ind.

[73] Assignee: RCA Corporation, Princeton, N.J.

[21] Appl. No.: 676,105

[22] Filed: Nov. 29, 1984

[51] Int. Cl.$^4$ .................. H03K 17/00; H03K 17/56
[52] U.S. Cl. .................................. 307/243; 307/239;
328/104; 328/154; 358/181
[58] Field of Search ............... 307/239, 243; 328/137,
328/104, 154; 358/181; 455/133, 136

[56] References Cited

U.S. PATENT DOCUMENTS

| | | | |
|---|---|---|---|
| 4,361,854 | 11/1984 | Wolfe | 358/181 |
| 4,363,033 | 12/1984 | Lovely | 358/181 |
| 4,521,180 | 6/1985 | Nigborowiez et al. | 358/181 |

OTHER PUBLICATIONS

Digest of Technical Papers, 1974 IEEE International Solid State Conference, Library of Congress Card No. 59-44023, pp. 120, 121 and 238.
An article by Richard C. Gerdes, Tucson, Ariz., p. 73, EDN Magazine, entitled "High-Level Analog Switch".
RCA Data Book for COS/MOS Integrated Circuits, printed 1974, pp. 574 and 575, "Transmission and Multiplexing of Analog or Digital Signals Utilizing the CD 4016A Quad Bilateral Switch".
RCA Data Book for COS/MOS Integrated Circuits, printed 1980, pp. 198-200, "COS/MOS Analog Multiplexers/Demultiplexers".
National Semiconductor Linear Applications Handbook, p. 32-12, "Highfrequency Switch".

Primary Examiner—Stanley D. Miller
Assistant Examiner—Richard Roseen
Attorney, Agent, or Firm—Paul J. Rasmussen; Peter M. Emanuel; Adel A. Ahmed

[57] ABSTRACT

A signal switching arrangement includes first and second switches coupled between a signal input terminal and a signal output terminal. A bias signal for causing the first switch to couple an input signal to the second switch is applied to the output terminal. The second switch is controlled by a control signal to selectively couple the bias signal to the first switch, thereby causing the input signal to be coupled to the output terminal through both switches. The arrangement is particularly well suited to form a relatively inexpensive signal multiplexer with good isolation characteristics.

20 Claims, 1 Drawing Figure

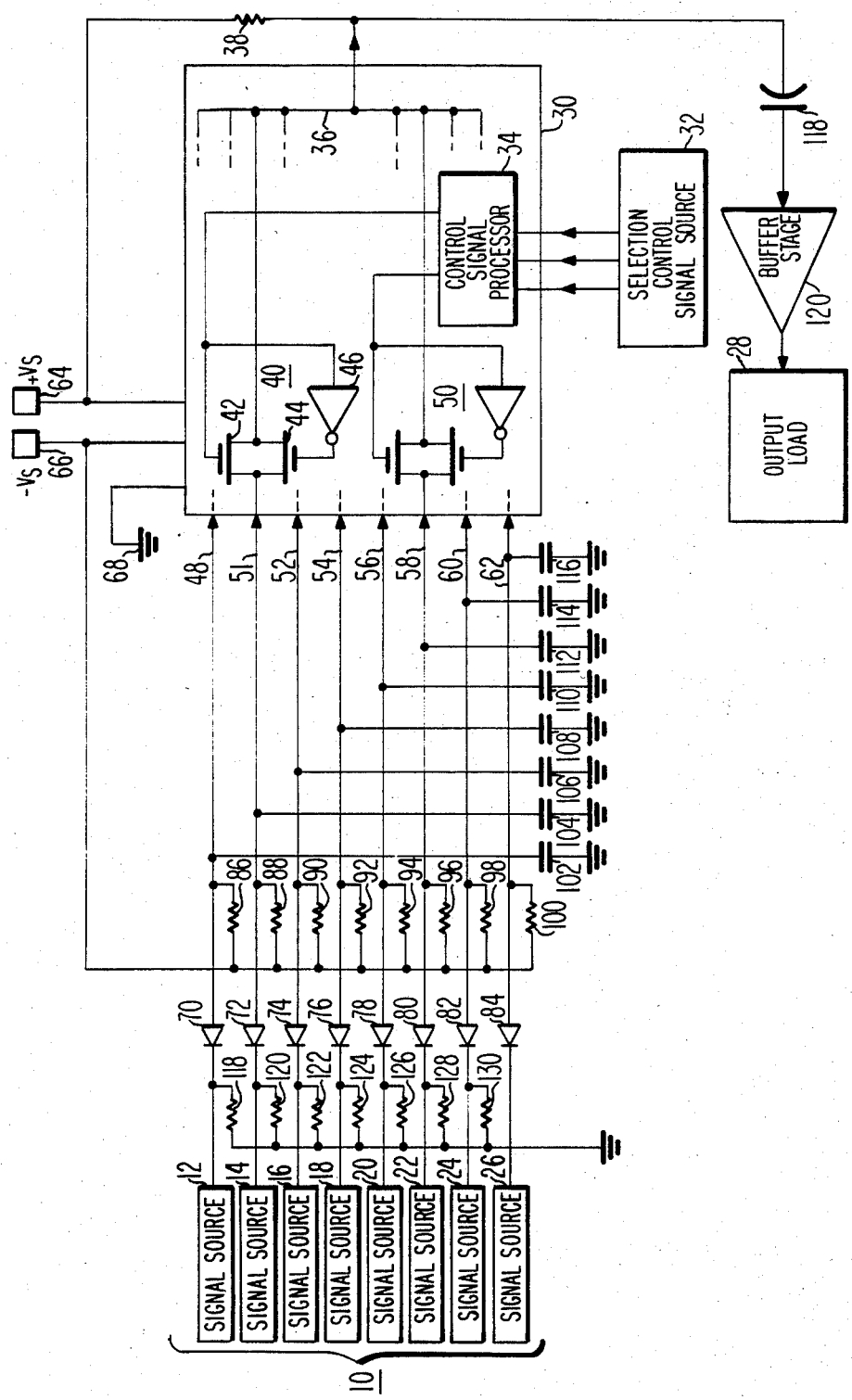

SIGNAL SOURCE SELECTOR

The present invention relates to the field of signal switching apparatus, and more particularly to apparatus for selecting a signal from a plurality of signals.

TV systems, such as receivers monitors and video recorders are nowadays being required to process signals from a number of alternate sources in addition to the video information conventionally derived from received radio frequency (RF) signals corresponding to channels selected by a tuner. Such sources include TV accessories such as magnetic tape and video disc players, video games and computers. With the increased use of such TV accessories, it has become desirable to provide a switching arrangement for selecting a particular source of video information from a number of available such sources.

Certain TV accessories typically provide a modulated RF output signal suitable for application to a tuner of the associated TV system. RF switches for selecting a particular RF signal source from a plurality of RF signal sources are known. Many TV accessories also provide baseband video and audio output signals.

The switches for selection of a signal from a plurality of signals have stringent requirements with regard to sufficient attenuation of unselected signals and related cross-talk between signals, especially at video and higher frequencies. Specially designed discrete switching circuits meeting such requirements are relatively expensive, and the performance of commercially available switching circuits incorporated in groups in an integrated circuit (IC) typically intended for audio or similar applications has generally proved to be inadequate for video amd RF applications as well as for certain high quality audio applications. In other respects, however, commercially available switching or signal multiplexing integrated circuits particulary those employing CMOS (Complementary metal-oxide semiconductor) devices do provide attractive features at relatively low cost. In typical devices of this kind, such as, for example, the CD 4051 series of CMOS IC multiplexers supplied by RCA Corporation, eight channels are available for selectively coupling one of eight input signals to an output, in response to logic control signals. While such features of IC multiplexers are very desirable, as explained, switching video and higher frequency signals usually requires greater attenuation of unselected signals than is available from such IC's alone.

In accordance with an aspect of the invention, a signal switching arrangement includes a source of a bias signal coupled to a signal output terminal. A first selectively operable switch has a first of two terminals coupled to the output terminal for receiving the bias signal and for supplying it an output signal. A second switch is coupled between a signal input terminal and the other terminal of the first switch, for coupling a signal between them, in response to the bias signal being coupled by the first switch.

Specifically, in accordance with a further aspect of the invention, a plurality of signal switching arrangements of the type described above are coupled between respective input terminals and a common output terminal at which a common bias signal is provided to form a multiplexer. Preferably the respective first switches of the switching arrangements are included in a multiplexer IC.

In accordance with a still further aspect of the invention, the respective second switches comprise diodes, such as p-i-n diodes.

The arrangement is particularly well suited to form a relatively inexpensive signal multiplexer with good isolation characteristics.

These and other aspects of the invention will be explained with reference to the accompanying Drawing in which the sole FIGURE shows, partly in block schematic form and partly in circuit schematic form, signal switching apparatus including a preferred embodiment of the present invention.

In the signal source selector shown in the FIGURE, a plurality 10 of, for example, eight signal sources, respectively designated by reference numerals 12, 14, 16, 18, 20, 22, 24, and 26, provide respective signals, such as, for example, video signals, one of which signals is to be selected by the signal source selector and supplied to an output load 28, such as the video signal processing section of a TV monitor or a TV receiver, for example. The particular signal source selection is determined by a selection control signal source 32 which applies binary selection control signals to a multiplexer unit 30. Multiplexers of this general type are commercially available and are widely used, such as for example, the previously mentioned CD 4051 "COS/MOS Analog Multiplexer/Demultiplexer", supplied by RCA Corporation.

Multiplexer unit 30 includes a control signal processor 34 which controls switching circuitry including, for example, eight switches so as to cause only the signal from the selected signal source to be supplied to output load 28, as will be explained in detail below. Two representative gates in multiplexer 30 are generally designated by reference numerals 40 and 50.

Each of the switches of multiplexer 30 is illustratively indicated as comprising CMOS transmission gates formed by the connection in parallel of the conduction paths of a pair of opposite conductivity type MOS field effect transistors (MOSFET's). Referring specifically to switch 40, control signal processor 34 applies a gate control signal directly to the gate of MOSFET 42 and as inverted by an inverter 46 to MOSFET 44. The gate control signal supplied by control signal processor 34 simultaneously causes both transistors to conduct or not to conduct. When both transistors 42 and 44 are in a conductive condition, a conductive path is provided between circuit point 36 and a circuit point 51. When transistors 42 and 44 are in a non-conductive condition, a substantially open circuit path exists between circuit point 36 and circuit point 51. Depending on the code represented by the binary signals applied by selection control signal source 32 to multiplexer 30, a conductive path of relatively low resistance will be provided between a selected one of circuit points 48, 51, 52, 54, 56, 58, 60, 62, and circuit point 36.

While multiplexer 30 alone provides sufficient isolation between a non-selected one of circuit points 48–62 and circuit point 36 for many applications, it does not provide sufficient isolation at video and higher frequencies since signals at these frequencies can be coupled to a significant extent to circuit point 36 by parasitic capacitances which exist across the switches of multiplexer 30. In accordance with the present invention, to enable the convenient and economical signal selector arrangement of IC multiplexer 30 to be used for applications such as at video and higher frequencies, requiring more isolation than it can provide by itself, circuit point 36 is provided with a bias current by means of resistor 38 which is conveniently connected to terminal 64 at which a positive supply voltage $+V_s$ is applied, and auxiliary diode switches 70, 72, 74, 76, 78, 80, 82 and 84 are connected to circuit points 48, 51, 52, 54, 56, 58, 60 and 62, respectively. This positive supply voltage is also conveniently used for supplying multiplexer 30 with a positive operating voltage. Multiplexer 30 is further supplied with a negative operating voltage $-V_s$ at a terminal 66 and with a reference potential, here conveniently indicated as a ground 68. Since each pair of the switches of multiplexer 30 and their respective associated auxiliary switches 70-84 cooperate in the same manner, the "on" and "off" operations of each pair will be explained by way of example with reference to switches 40 and 50 and diodes 72 and 80, respectively.

Specifically, circuit point 51, associated with switch 40 is connected to the anode of a diode 72, to one end of a resistor 88, whose other end is connected to the negative supply terminal 66, and to one plate of a capacitor 104, whose other plate is connected to ground. The cathode of diode 72 is connected to signal source 14 and to ground by way of a resistor 120. The relative resistance values of resistors 38 and 88 are selected such that when gate 40 is in a conductive condition, a positive voltage with respect to ground is applied to the anode of diode 72. This voltage is derived by resistor 38, the resistance of switch 40, and resistor 88, together forming a voltage divider between the positive supply $+V_s$ and the negative supply $-V_s$. Since the cathode of diode 72 is connected to ground by way of resistor 120, it will be biased more negatively than the anode when switch 40 is in a conductive condition, causing diode 72 to be forward biased. Diode 72 will therefore exhibit a relatively low forward biased impedance and it will therefore permit a signal from signal source 14 to be conducted by way of its low impedance through transmission gate 40 to circuit point 36. Circuit point 36 is coupled by way of a DC isolating capacitor 118 and a buffer stage 120 to output load 28.

As explained, when one of the switches in multiplexer 30 has been selected to be in its "on" or low impedance condition, all the remaining gates will be in an "off" or high impedance condition. For the purpose of explanation, it will therefore be sufficient to describe the circuit with reference to one representative switch which is in a high impedance condition. For example, when gate 40 is in a conductive condition, gate 50 will be in a high impedance condition, and the relatively positive potential on circuit point 36 will not be communicated to circuit point 58. Consequently, the anode of diode 80 will be at a relatively negative potential, due to its connection by way of resistor 96 to the negative supply voltage $-V_s$. Since the cathode of diode 80 is connected to ground by way of resistor 128, diode 80 will be reverse-biased and it will exhibit a relatively high impedance. Consequently, a signal from signal source 22 will not be coupled to any appreciable extent by diode 80 to circuit point 58. Any small signal voltage coupled by stray capacitance in diode 80 (which has a relatively high impedance) will tend to be shunted to the negative supply $-V_s$ by resistor 96 and directly to ground by a capacitor 112 and will therefore be highly attenuated at circuit point 58. A residual small signal on circuit point 58 will be further attenuated by the high series impedance of gate 50 and the shunt resistance of resistor 38. Similarly, the positive potential on circuit point 36 will not be communicated to any of circuit points 48, 52, 54, 56, 60 and 62 since the corresponding gates (not shown) will be in a high impedance condition. Consequently, the anodes of diode 70, 74, 76, 78, 82, and 84 will be at a relatively negative potential due to resistors 86, 90, 92, 94, 98, and 100, respectively being connected to the negative supply $-V_s$. Since their cathodes are connected to ground by way of resistors 118, 122, 124, 126, and 130, respectively, diodes 70, 74, 76, 78, 82, and 84 will be reverse-biased and will exhibit a high impedance to signals from sources 12, 16, 18, 20, 24 and 26, respectively. Small residual signals coupled by way of stray capacitances will be shunted to ground by capacitors 102, 106, 108, 110, 114, and 116, respectively. As in the case of gate 50, all of the gates in multiplexer 30 which are in a nonconductive or high impedance state will exhibit a high impedance for undesired signals, which will also be shunted by resistor 38. The desired signal, from signal source 14 in the present example, will therefore appear at output load 28 relatively free of interference from any of the unselected signal sources.

Clearly it is desirable for the diode corresponding to the selected signal, such as diode 72 in the present example, to exhibit, as much as possible, a low forward impedance and for the non-selected diodes to exhibit, as much as possible, a high impedance. The non-selected diodes must therefore exhibit a particularly small capacitance in their non-conductive condition. With reference to the described embodiment, it has been found that particularly satisfactory performance is obtained with diodes of the well known and commercially available "p-i-n" type. As is known, such diodes use a single p-n junction on one side of which is relatively a thick layer of high resistivity semiconductor (the "intrinsic" layer). However, other types of diode may also provide suitable characteristics.

Clearly the implementation of the invention in accordance with the FIGURE is illustrative. Various modifications to the circuitry for implementing the invention in accordance with the foregoing description will readily suggest themselves to ones skilled in the art. For example, the choice of ground as a common reference potential and the illustrated polarity senses of the diodes may be modified to suit a particular application. By application of the circuit principle of duality, it will also be apparent that rearrangement of the circuitry is possible such that diode switches are in shunt with the signal path rather than in series, so that the signal will be coupled when the diode is non-conductive and will not be coupled when the diode is conductive. Furthermore, while multiplexer 30 has been shown as incorporating CMOS gates, it is clearly not essential that complementary symmetry gates be used, or even that MOS devices be used, since the requirements can be fulfilled by various other types of semiconductor devices or indeed, even by reed relays.

What is claimed is:

1. Signal switching apparatus comprising:
 a signal input terminal for receiving an input signal;
 an output terminal;
 a source of a bias signal coupled to said output terminal;
 first switch means having first and second terminals for selectively coupling signals therebetween, said first terminal being coupled to said source for receiving said bias signal and to said output terminal for selectively supplying a signal to said output terminal and said bias signal to said second terminal; and second switch means coupled between said signal input terminal and said second terminal of said first switch means, for coupling a signal therebetween in response to said bias signal being coupled by said first switch means.

2. The apparatus recited in claim 1 wherein said second switch means comprises diode means and wherein said bias signal source includes current supply means for biasing said diode means into one of a conducting condition and a substantially non-conducting condition for providing said coupling.

3. The apparatus recited in claim 2 wherein said current supply means biases said diode means into forward conduction when said diode means is in said conducting condition.

4. The apparatus recited in claim 3 wherein said diode means comprises a p-i-n diode.

5. A signal source selector comprising:
a plurality of signal input terminals for receiving respective signals to be selected;
an output terminal for providing a selected signal;
a source of a selection signal;
a first plurality of selectively operable switch means, said switch means having respective first and second terminals and being individually responsive to said selection signal for coupling a signal therebetween, said respective first terminals being coupled to said output terminal;
a source of a bias signal coupled to said output terminal for applying said bias signal thereto; and
a second plurality of controllable switch means, said switch means of said second plurality being coupled between respective ones of said signal input terminals and respective ones of said second terminals of said switch means of said first plurality, for coupling a signal therebetween in response to said bias signal being coupled by said selectively operable switch means of said first plurality.

6. The signal source selector recited in claim 5 wherein all of said first plurality of selectively operable switch means is in a single integrated circuit.

7. The signal source selector recited in claim 6 whdrein said controllable switch means of said second plurality individually comprise diode means for providing said coupling.

8. The signal source selector recited in claim 5 wherein said bias signal source includes current supply means for biasing said diode means into one of a conducting condition and a substantially non-conducting condition for providing said coupling when said bias signal is being coupled by said switch means of said first plurality.

9. The signal source selector recited in claim 7 wherein said diode means comprises a diode for series coupling of said selected signal and a shunt element having a signal shunting impedance that is relatively great compared with the impedance of said diode in a substantially conducting state.

10. The signal source selector recited in claim 8 wherein said bias signal source comprises current source means for providing a forward biasing current to said diode when said diode means is in said conducting condition.

11. The signal source selector recited in claim 10 wherein said diode is a p-i-n diode.

12. The signal source selector recited in claim 11 wherein said selectively operable switch means of said first plurality individually comprise field effect transistor analog switch means for coupling said selected signal.

13. A signal source selector comprising:
a plurality of signal input terminals for receiving respective signals to be selected;
a plurality of intermediate circuit points;
an output terminal for providing a selected signal;
a source of a selection signal;
a first plurality of selectively operable switch means, said switch means being coupled between said output terminal and respective ones of said intermediate circuit points and being individually responsive to said selection signal for coupling a signal therebetween;
a source of a bias signal coupled to said output terminal for applying said bias signal thereto; and
a second plurality of controllable switch means, said switch means of said second plurality being coupled between respective ones of said signal input terminals and respective ones of said intermediate circuit points for coupling a signal therebetween responsive to said bias signal being coupled to said respective ones of said intermediate circuit points.

14. The signal source selector recited in claim 13 wherein all of said first plurality of selectively operable switch means is in a single integrated circuit.

15. The signal source selector recited in claim 13 wherein said controllable switch means of said second plurality individually comprise diode means for exhibiting a relatively high impedance in a first conduction state amd a relatively low impedance in a second conduction state.

16. The signal source selector recited in claim 15 wherein said controllable switch means of said second plurality selectively couples said signal when said diode means is in one of said first and second states and substantially decouples said signal when said diode means is in the other of said first and second states.

17. The signal source selector recited in claim 16 wherein said source of a bias signal comprises bias means for causing said diode means to be in one of said first and second states when said bias signal is being coupled by said first switch means and for causing said diode means to be in the other of said first and second states when said bias signal is not being coupled by said first switch means.

18. The signal source selector recited in claim 15 wherein said controllable switch means of said second plurality couples said signal when said diode means is in said second conduction state and further including respective shunt means individually exhibiting a relatively low impedance compared with the impedance of said diode means in said first conduction state and being coupled to respective ones of said intermediate circuit points for shunting a signal thereat.

19. The signal source recited in claim 18 wherein all of said first plurality of selectively operable switch means is in a single integrated circuit.

20. The signal source selector recited in claim 19 wherein said diode means comprises a p-i-n diode and wherein said selectively operable switch means of said first plurality individually comprise field-effect semiconductor switch means for coupling said signal.

* * * * *